United States Patent
D'Abreu et al.

(10) Patent No.: US 8,261,136 B2
(45) Date of Patent: Sep. 4, 2012

(54) METHOD AND DEVICE FOR SELECTIVELY REFRESHING A REGION OF A MEMORY OF A DATA STORAGE DEVICE

(75) Inventors: Manuel Antonio D'Abreu, El Dorado Hills, CA (US); Stephen Skala, Fremont, CA (US)

(73) Assignee: Sandisk Technologies Inc., Plano, TX (US)

( * ) Notice: Subject to any disclaimer, the term of this patent is extended or adjusted under 35 U.S.C. 154(b) by 686 days.

(21) Appl. No.: 12/494,210

(22) Filed: Jun. 29, 2009

(65) Prior Publication Data

US 2010/0332943 A1 Dec. 30, 2010

(51) Int. Cl.
*G06F 11/10* (2006.01)
*G06F 12/16* (2006.01)
(52) U.S. Cl. .................................................. 714/708
(58) Field of Classification Search .................. 714/708
See application file for complete search history.

(56) References Cited

U.S. PATENT DOCUMENTS

| | | | |
|---|---|---|---|
| 5,732,092 A | 3/1998 | Shinohara | |
| 5,774,647 A * | 6/1998 | Raynham et al. | 714/48 |
| 5,818,762 A | 10/1998 | Maari et al. | |
| 7,173,852 B2 * | 2/2007 | Gorobets et al. | 365/185.09 |
| 7,249,289 B2 * | 7/2007 | Muranaka et al. | 714/48 |
| 7,260,011 B2 * | 8/2007 | Riho et al. | 365/222 |
| 7,290,203 B2 * | 10/2007 | Emma et al. | 714/809 |
| 7,325,090 B2 | 1/2008 | Ronen | |
| 8,156,392 B2 * | 4/2012 | Flynn et al. | 714/723 |
| 2005/0289061 A1 | 12/2005 | Kulakowski et al. | |
| 2006/0039196 A1 * | 2/2006 | Gorobets et al. | 365/185.01 |
| 2007/0211532 A1 | 9/2007 | Gonzalez et al. | |
| 2007/0260811 A1 | 11/2007 | Merry, Jr. et al. | |
| 2008/0072116 A1 * | 3/2008 | Brittain et al. | 714/758 |
| 2008/0098157 A1 | 4/2008 | Andrewartha et al. | |
| 2009/0282301 A1 * | 11/2009 | Flynn et al. | 714/710 |
| 2010/0106901 A1 * | 4/2010 | Higeta et al. | 711/106 |
| 2011/0194369 A1 * | 8/2011 | Jeddeloh | 365/222 |

FOREIGN PATENT DOCUMENTS

WO 2005106886 A2 11/2005

OTHER PUBLICATIONS

International Search Report and Written Opinion received in corresponding PCT Application No. PCT/US2010/039708 from the International Searching Authority (EPO) mailed Aug. 5, 2010, 18 pages.

* cited by examiner

*Primary Examiner* — Stephen M Baker
(74) *Attorney, Agent, or Firm* — Toler Law Group, PC (57) ABSTRACT

A method and device for selectively refreshing a region of a non-volatile memory of a data storage device is disclosed. In a particular embodiment, a method is disclosed that includes comparing a time stamp received from a host device to a first time stamp retrieved from a data storage device for a first region of a non-volatile memory, the first region including a least recently accessed region of a memory array within the data storage device. The method also includes selectively refreshing the first region based on a comparison of a difference between the time stamp received from the host device and the first time stamp as compared to a threshold, where the threshold is adjusted based on a first error count corresponding to a number of errors detected by an error correction code (ECC) engine with respect to data retrieved from the first region.

22 Claims, 6 Drawing Sheets

METHOD AND DEVICE FOR SELECTIVELY REFRESHING A REGION OF A MEMORY OF A DATA STORAGE DEVICE

I. FIELD

The present disclosure is generally related to selectively refreshing a region of a non-volatile memory of a data storage device.

II. DESCRIPTION OF RELATED ART

Data stored in a non-volatile memory may be lost due to data retention issues with the non-volatile memory. For example, data stored in a NAND-based solid state drive (SSD) may be lost due to data retention issues with the NAND-based SSD. If the number of errors in a page or a block of memory exceeds the capability of the error detection code (EDC) and error correction code (ECC) techniques used, the page or the block may be marked as bad. The block may be replaced if spare blocks are available. However, if spare blocks are not available, a data storage device using the NAND-based SSD may fail to function. Therefore, it is desirable to improve data storage techniques to reduce data loss due to data retention issues.

III. SUMMARY

Data may be read from a region of non-volatile memory in a data storage device. The region may be a least recently accessed region of the non-volatile memory. An error correction code (ECC) engine may determine an error count by determining a number of errors in the data stored in the region. A threshold (e.g., a time period between selective refresh operations) may be adjusted to produce an adjusted threshold based on error count (e.g., a high error count may result in a low adjusted threshold to induce more frequent refresh operations, and vice versa). Refresh logic may compare a time difference between a time stamp received from a host device and a time stamp from the region to the adjusted threshold. The refresh logic may selectively refresh the region based on the comparison of the time difference and the adjusted threshold (e.g., when the time difference exceeds the adjusted threshold). The process may be repeated for other regions of the non-volatile memory. Advantageously, all the calculations may be performed using the time stamp of the host device. Thus, the procedure may be performed on non-volatile memory devices that do not maintain separate clocks. Other aspects, advantages, and features of the present disclosure will become apparent after review of the entire application, including the following sections: Brief Description of the Drawings, Detailed Description, and the Claims.

V. DETAILED DESCRIPTION

Figure 1:
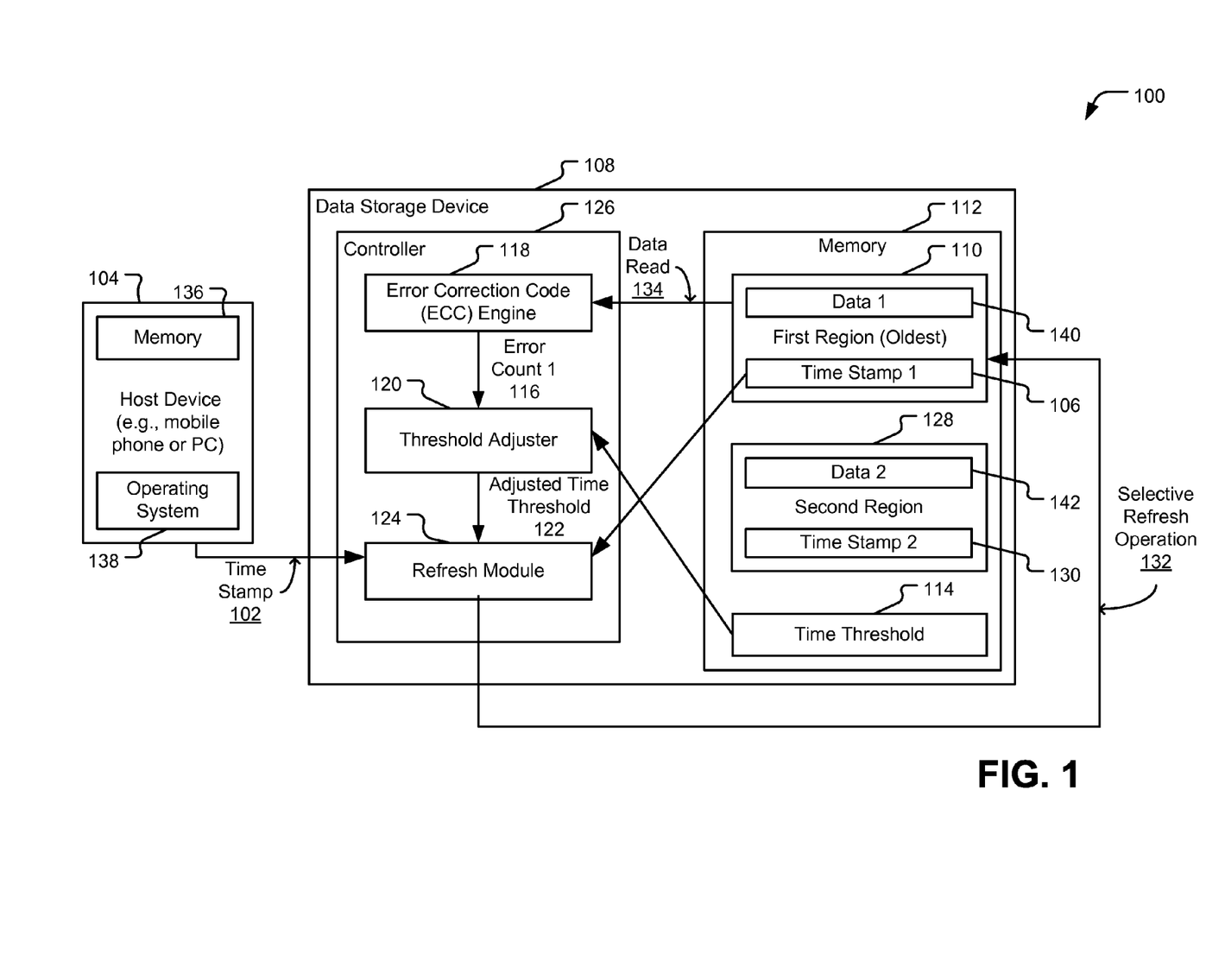
FIG. 1 is an illustrative diagram of a host device and a data storage device having a memory and a controller configured to selectively refresh regions of the memory.

Particular embodiments of the present disclosure are described with reference to the drawings. Referring to FIG. 1, an illustrative diagram of a host device and a data storage device having a controller and a memory is depicted and generally designated 100. A data storage device 108 includes a memory 112 (e.g., a non-volatile memory) and a controller 126. The data storage device 108 is detachedly couplable to a host device 104, such as a mobile phone or a personal computer (PC). The host device 104 includes a memory 136 and an operating system 138. The memory 112 within the data storage device 108 includes a first region 110 that includes a least recently accessed region of a memory array. The first region 110 includes first data 140 and a first time stamp 106. The memory 112 also includes a second region 128 that includes a region of the memory array that is more recently accessed than the first region 110. The second region 128 includes second data 142 and a second time stamp 130. The memory 112 further includes a time threshold 114. The controller 126 includes an error correction code (ECC) engine 118, a threshold adjuster 120, and a refresh module 124. The controller 126 may be configured to selectively refresh regions of the memory 112, such as the first region 110 and the second region 128.

The data storage device 108 stores a time stamp for each region of the memory 112. For example, the first region 110 of the memory 112 includes the first time stamp 106 and the second region 128 of the memory 112 includes the second time stamp 130. In a particular embodiment, the first time stamp 106 is updated when the first data 140 is written to the first region 110, and the second time stamp 130 is updated when the second data 142 is written to the second region 128. The first time stamp 106 may be updated when the first data 140 is accessed and the second time stamp 130 may be updated when the second data 142 is accessed.

The error correction code (ECC) engine 118 reads data from the memory 112 and determines the number of errors in the data read from the memory 112. For example, the ECC engine 118 may read the first data 140 from the first region 110 of the memory 112 via a data read operation 134 and may store a number of counted errors with respect to the first data 140 as the first error count 116. The ECC engine 118 may attempt to correct the errors detected in the data read from the memory 112 when the number of detected errors does not exceed an error threshold. For example, the ECC engine 118 may count 50 data errors in a particular region (e.g., block or page) of data, such as the first data 140 within the first region 110. When the error threshold is greater than the counted number of data errors (e.g., when the error threshold is 100), the ECC engine 118 may attempt to correct all the errors in the data read from the particular region. In contrast, when the error threshold is less than the counted number of data errors (e.g., when the error threshold is 20), the ECC engine 118 may not attempt to correct all the errors in the data read from the particular region. Instead, the particular region may be marked as "bad" or "corrupt" as described herein.

The ECC engine 118 may also determine trends in the number of data errors in regions of the memory 112. For example, the ECC engine 118 may detect 70 errors in data from a particular page at a first time and may detect 90 errors in data from the particular page at a later time (e.g., one month later). Based on the detected errors, the ECC engine 118 may determine that the particular page has an increasing error rate of approximately 20 errors per month. By counting and tracking the number of errors in data read from the memory 112, the ECC engine 118 may provide a measure of the integrity of the data stored in the memory 112. Furthermore, by correcting errors when possible, the ECC engine 118 may improve the integrity of the data. Examples of ECC engines include those based on repetition codes, Hamming codes, multidimensional parity-check codes, Reed-Solomon codes, turbo codes, BCH codes, Reed-Muller codes, Binary Golay codes, low-density parity-check codes, and the like.

The threshold adjuster 120 adjusts a time threshold 114 based on the first error count 116 from the ECC engine 118 to produce an adjusted time threshold 122. The time threshold 114 may generally indicate how often to refresh each region of the memory 112 (e.g., monthly or yearly). The adjusted time threshold 122 may be used in determining whether or not to selectively refresh a particular region of the memory 112. For example, the threshold adjuster 120 may decrease the time threshold 114 to produce a lower adjusted time threshold 122 when the first error count 116 indicates a high number of errors, so that the first region 110 is selectively refreshed more often. Alternately, when the first error count 116 indicates a lower number of errors, the adjusted time threshold 122 may be kept high so that the first region is selectively refreshed less often. For example, if the first error count 116 is 200, the adjusted time threshold 122 may be lowered from one month to one week, whereas if the first error count 116 is 20, the adjusted time threshold 122 may be raised from one month to six months.

The refresh module 124 determines a time difference between a time stamp 102 received from the host device 104 and the first time stamp 106 read from the first region 110. Based on a comparison of the time difference and the adjusted time threshold 122, the refresh module 124 may initiate a selective refresh operation 132 of the first region 110. For example, when the time difference between the time stamp 102 and the first time stamp 106 is greater than or equal to the adjusted time threshold 122, the refresh module 124 initiates a selective refresh operation 132 on the first region 110. When the time difference is less than the adjusted time threshold 122, the refresh module may not initiate the selective refresh operation 132 of the first region 110. For example, when the time difference is 30 days and the adjusted time threshold 122 is one week, the refresh module 124 may initiate the selective refresh operation 132 of the first region 110. In contrast, when the time difference is 4 days and the adjusted time threshold 122 is one week, the refresh module 124 may not initiate the selective refresh operation 132 of the first region 110. Selectively refreshing a particular region of memory may include one or more of performing a read scrub, moving data from the particular region to a different region, or some other refresh action.

In a particular embodiment, the refresh module 124 may also initiate the selective refresh operation 132 based on evaluating the time stamp 102 received from the host device 104. For example, the time stamp 102 may be received from the host device 104 when the data storage device 108 is turned on. The host device 104 may include a portable communication device (e.g., a mobile phone) that provides the time stamp 102 to the data storage device 108 upon connection of the data storage device 108 to the portable communication device. By comparing a newly received time stamp from the host device 104 to a previously received time stamp from the host device 104, the refresh module 124 may determine how long it has been since the last time the data storage device 108 was turned on. This time interval may be used in preventing loss of data. For example, one or more regions of the memory 112 may be selectively refreshed when the time interval indicates that the data storage device 108 has not been turned on in a certain length of time (e.g., over two years). When the host device 104 includes a portable communication device, the selective refresh operation 132 may be performed in a background mode of the controller 126 of the data storage device 108.

Thus, the time stamp 102 may be based on a native clock/day stamp of the host device 104. When the host device 104 includes a computer, the time stamp 102 may be determined from a file system or directory system of the host device 104. For example, the NT file system (NTFS) and the MacOS, Windows, and Linux operating systems record a time stamp for a file when the file is created. When the host device 104 includes a mobile phone, the time stamps 102 may be retrieved from a service provider for the mobile phone. When the host device 104 includes a navigation unit, the time stamp 102 may be a native time stamp of the navigation unit.

In operation, the controller 126 may receive a time stamp 102 from the host device 104. The time stamp 102 may be used to selectively refresh one or more regions of the memory 112. For example, the first data 140 may be read from the first region 110 of the memory 112 via a data read operation 134. The number of errors in the first data 140 may be determined by the ECC engine 118 to produce a first error count 116. The threshold adjuster 120 may adjust the time threshold 114 used to determine a refresh time based on the first error count 116, thereby producing the adjusted time threshold 122. A time difference between the time stamp 102 and the first time stamp 106 of the first region 110 may be compared to the adjusted time threshold 122. Based on the comparison, the refresh module 124 may initiate a selective refresh operation 132 to selectively refresh the first region 110. For example, when the time difference indicates that the first data 140 is six months old and the adjusted time threshold 122 is three months, the refresh module 124 may initiate the selective refresh operation 132 to selectively refresh the first region 110 in an attempt to prevent data loss.

The second region 128 may be similarly processed. The second data 142 may be read and the ECC engine 118 may generate a second error count in the manner described above with reference to the first error count 116. The second error count may be used by the threshold adjuster 120 to adjust the time threshold 114 to produce a second adjusted threshold, similar to the adjusted threshold 122. Based on a comparison of the second adjusted threshold to a difference between the time stamp 102 and the second time stamp 130, the refresh module 124 determines whether to selectively refresh the second region 128.

It will be appreciated that the data storage device 108 may thus detect a page or a block of memory (or other region of memory) where wear-out or defects are likely to occur. The data storage device 108 may also track the error rate of a page or a block of memory over time. Firmware (e.g., firmware embedded in the controller 126) may take actions based on increasing error rates (e.g., initiating a read scrub, moving data to a different block or page of memory, marking blocks with exceptionally high error data as "bad," or any combination thereof). Data may also be refreshed based on a period of time that has elapsed since the data storage device 108 was last powered on, read from, or written to.

It will also be appreciated that the controller 126 may perform selective refresh calculations using the time stamp 102 of the host device 104. Thus, data retention loss may be reduced in data storage devices that do not maintain a separate clock.

Figure 2:
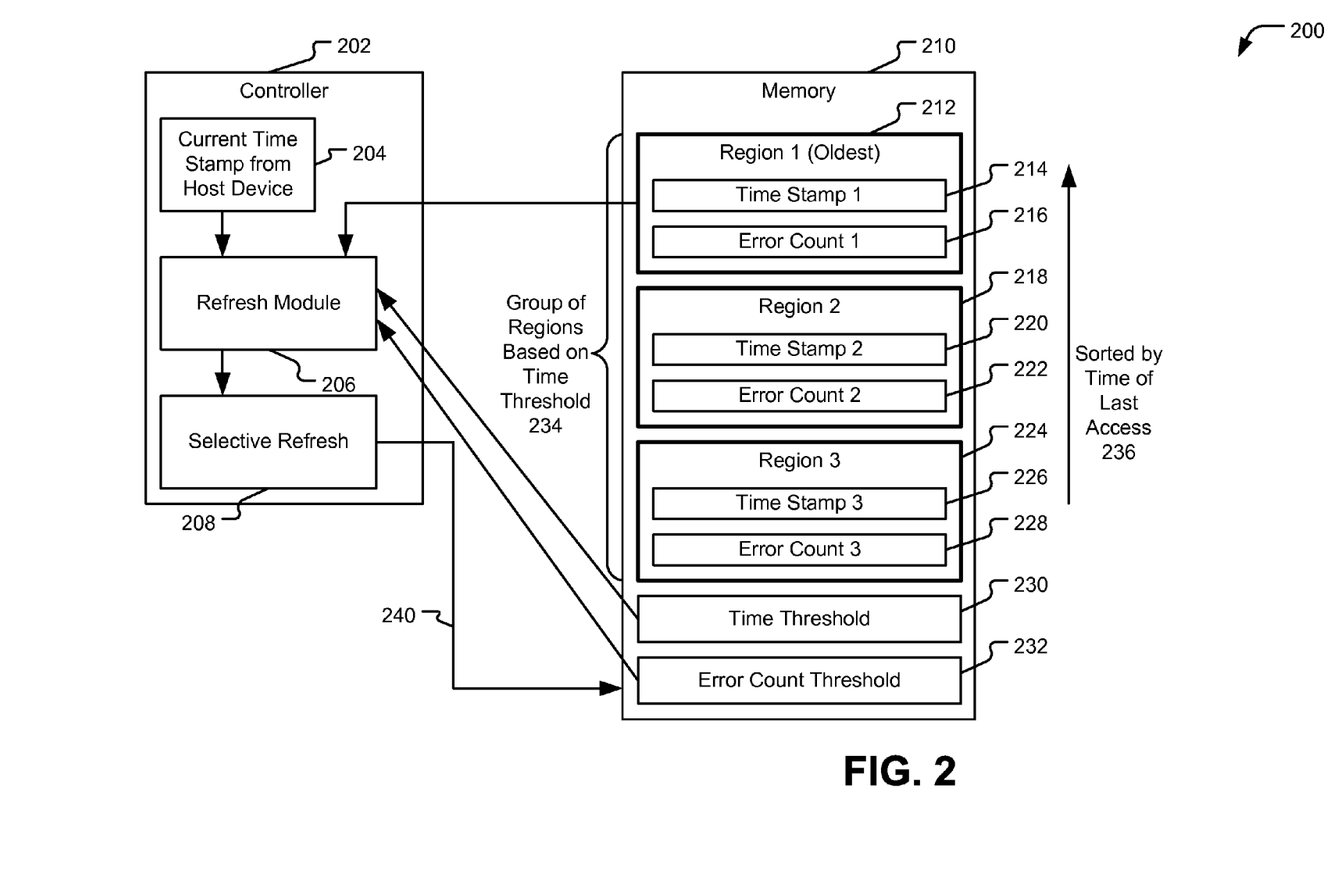
FIG. 2 is an illustrative diagram of a memory and a controller configured to selectively refresh regions of the memory of a data storage device.

Referring to FIG. 2, an illustrative diagram of a controller and a memory of a data storage device is depicted and generally designated 200. A data storage device, such as the data storage device 108 of FIG. 1, includes a controller 202 and a memory 210, such as a non-volatile memory. The controller 202 includes a current time stamp received from a host device 204 and a refresh module 206 that can initiate a selective refresh 208. The memory 210 includes a first region 212, such as the first region 110 of FIG. 1, including a region of the memory 210 that is least recently accessed. The first region 212 includes a first time stamp 214, such as the first time stamp 106 of FIG. 1, and a first error count 216. In an illustrative embodiment, the first error count 216 is determined as described herein with reference to the first error count 116 of FIG. 1.

The memory 210 also includes a second region 218, such as the second region 128, including a region more recently accessed than the first region 212. The second region 218 includes a second time stamp 220, such as the second time stamp 130 of FIG. 1, and a second error count 222. In an illustrative embodiment, the second error count 222 is determined based on a number of errors detected by an ECC engine such as the ECC engine 118 of FIG. 1.

The memory 210 further includes a third region 224 including a region more recently accessed than the second region 218. The third region 224 includes a third time stamp 226 and a third error count 228. In an illustrative embodiment, the third error count 228 is determined based on a number of errors detected by an ECC engine, such as the ECC engine 118 of FIG. 1.

The memory 210 also includes a time threshold 230 and an error count threshold 232. A group of regions 234 including the first region 212, the second region 218, and the third region 224 may be selected based on a time threshold, such as the time threshold 230. For example, the group of regions 234 may be selected because each of the regions is older than about one month and the time threshold 230 is one month. The group of regions 234 including the first region 212, the second region 218, and the third region 224 may be sorted by a time of last access 236 for each of the regions. The first error count 216, the second error count 222, and the third error count 228 may be selectively compared to an error count threshold, such as the error count threshold 232. For example, the first error count 216 may be 200, the second error count 222 may be 120, and the third error count 228 may be 80, and these error counts may be selectively compared to the error count threshold 232 which may be 100, for example.

The first region 212 may be selectively refreshed based on a comparison of the first error count 216 and the error count threshold 232. The refresh module 206 may compare the first error count 216 and the error count threshold 232 and initiate the selective refresh 208 to selectively refresh the first region 212, as shown at 240. For example, when the first error count 216 is greater than the error count threshold, the refresh module 206 may initiate the selective refresh 208 to selectively refresh the first region 212. In contrast, when the first error count 216 is less than the error count threshold 232, the refresh module 206 may not initiate the selective refresh 208. The first region 212 may be selectively refreshed first, the second region 218 may be selectively refreshed second, and the third region 224 may be selectively refreshed third. The selective refreshing of the first region 212, the second region 218, and the third region 224 may be stopped based on the time threshold 230 or the error threshold 232. For example, when the time threshold 230 is one week and the error threshold 232 is 100 errors, regions that have a time stamp over a week old and over 100 errors may be selectively refreshed, whereas regions that have a time stamp less than a week old or fewer than 100 errors may not be selectively refreshed.

The refresh operation may be an iterative process that examines oldest pages or oldest blocks first and chooses whether or not to selectively refresh a page or block of data based on the time stamp associated with the page or block of data, the number or errors in the data detected by an ECC engine, or a combination of both. The refresh operation may examine the memory array region-by-region until the refresh operation determines there is no need to check newer regions, either because the newer regions were more recently created or refreshed or because the older regions have low data error rates.

The refresh module 206 may implement the iterative selective refresh process by examining regions of memory that are sorted in order of oldest (e.g., least recently modified or accessed) to newest (e.g., most recently modified or accessed). Thus, as illustrated in FIG. 2, the refresh module 206 may examine the first region 212 first since the first region is the oldest region. The refresh module 206 may first compare a difference between the current time stamp from the host device 204 and the first time stamp 214 as compared to the time threshold 230 and may compare the first error count 216 and the error count threshold 232 and initiate the selective refresh 208 to selectively refresh the first region 212, as shown at 240. In a second iteration, the refresh module 206 may compare a difference between the current time stamp from the host device 204 and the second time stamp 220 as compared to the time threshold 230 and may compare the second error count 222 and the error count threshold 232 and initiate the selective refresh 208 to selectively refresh the second region 218, as shown at 240. In a third iteration, the refresh module 206 may compare a difference between the current time stamp from the host device 204 and the third time stamp 226 as compared to the time threshold 230 and may compare the third error count 228 and the error count threshold 232 and determine that the third region 224 should not be refreshed.

It will thus be appreciated that by grouping regions of the memory 210 based on time or error count, performance of the iterative refresh process may be improved. For example, the refresh module 206 may "break" the iterative refresh process when the only regions remaining to be examined are newer than the time threshold 230 or have error counts lower than the error count threshold 232, thereby saving time and power.

Figure 3:
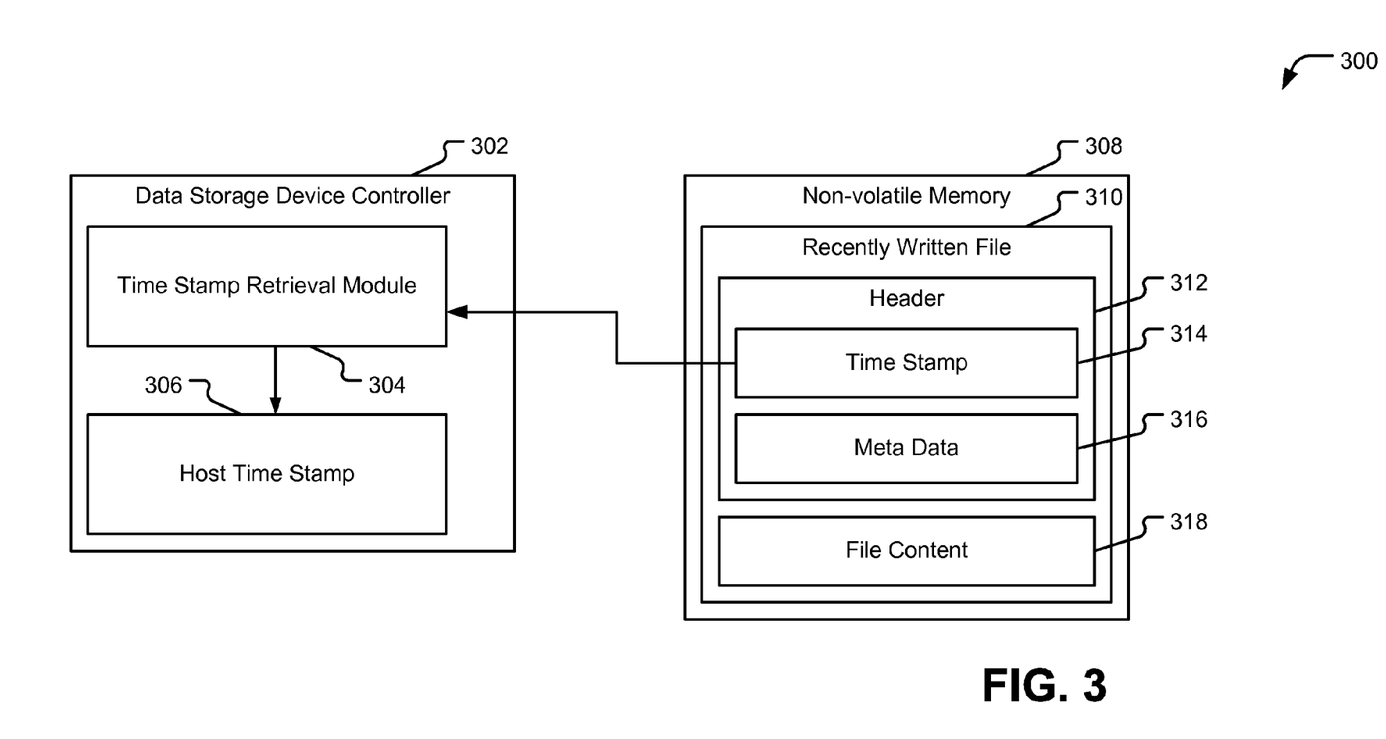
FIG. 3 is an illustrative diagram of a non-volatile memory and a data storage device controller configured to selectively refresh regions of the non-volatile memory.

Referring to FIG. 3, an illustrative diagram of a data storage device controller and a non-volatile memory is depicted and generally designated 300. A data storage device, such as the data storage device 108 of FIG. 1, includes a data storage device controller 302 and a non-volatile memory 308. The data storage device controller 302 includes a time stamp retrieval module 304 that is configured to update a host time stamp 306. The non-volatile memory 308 includes a recently written file 310. The recently written file 310 includes a header 312 and file content 318. The header 312 includes a time stamp 314 and meta data 316 related to the file content 318.

The time stamp retrieval module 304 may retrieve the time stamp 314 from the header 312 of the recently written file 310. The time stamp 314 may have been stored by an operating system of a host computer, such as the operating system 138 of FIG. 1 of the host device 104 of FIG. 1. The time stamp retrieval module 304 may retrieve the time stamp 314 from the header 312 of the recently written file 310 and store the retrieved time stamp 314 as the host time stamp 306. For example, the time stamp 314 of "Jun. 22, 2009, 9:12 AM" may be retrieved by the time stamp retrieval module 304 by accessing the file header 312 of a file stored by the host device 104 by the operating system 138 at the host device 104. Thus, the data storage device controller 302 may determine and update the host time stamp 306 based on files stored at a host computer instead of requesting the host time stamp 306 from the operating system of the host computer.

Figure 4:
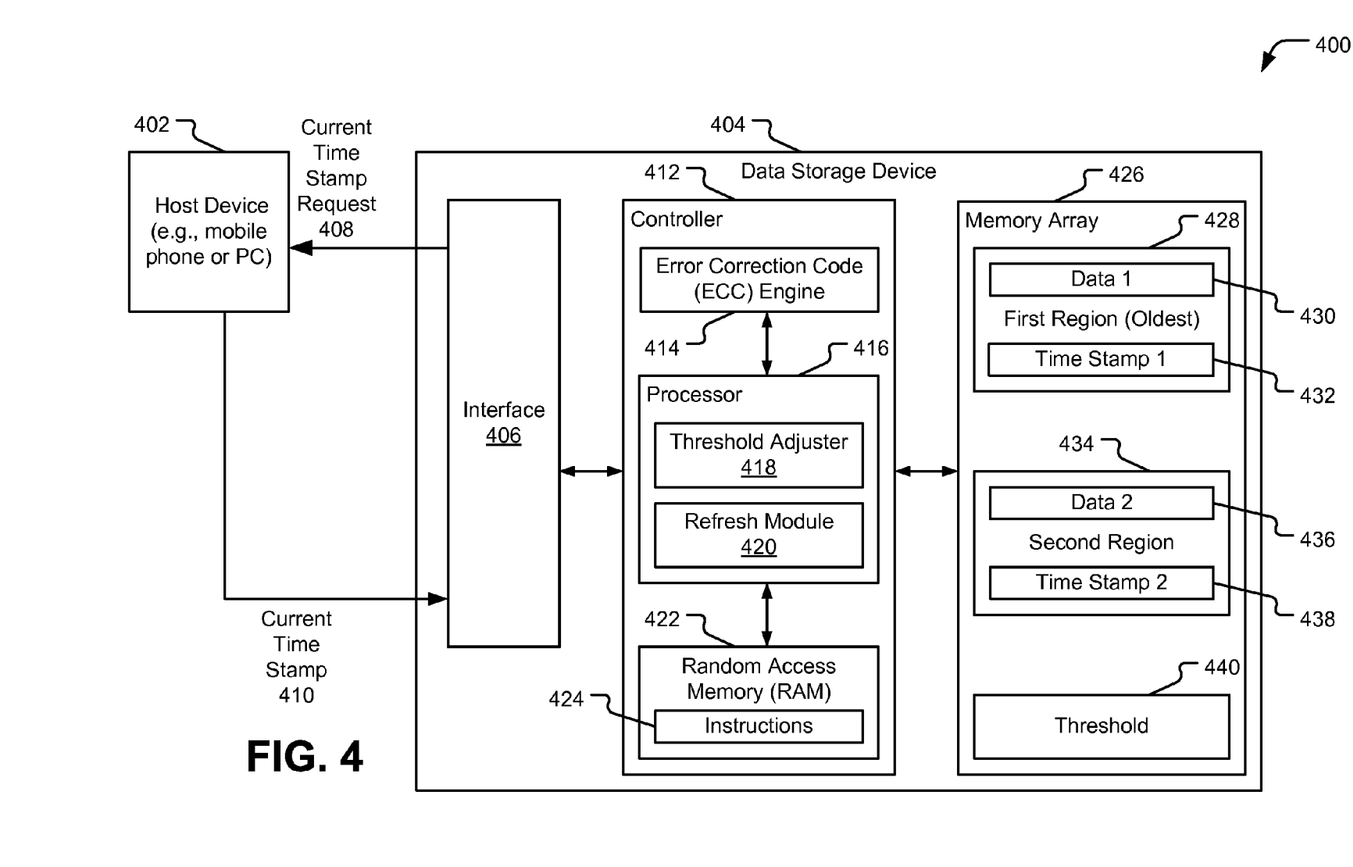
FIG. 4 is an illustrative diagram of a host device and a data storage device having an interface, a memory array, and a controller configured to selectively refresh regions of the memory array.

Referring to FIG. 4, an illustrative diagram of a host device and a data storage device having an interface, a controller, and a memory array is depicted and generally designated 400. A data storage device 404 includes a memory array 426, such as a memory array in a non-volatile memory, coupled to a controller 412 that is coupled to an interface 406. The data storage device 404 is detachedly couplable to a host device 402, such as a mobile phone or a personal computer (PC). The memory array 426 includes a first region 428 that includes a least recently accessed region of the memory array 426. The first region 428 includes first data 430 and a first time stamp 432. The memory array 426 also includes a second region 434 that includes a region of the memory array 426 that is more recently accessed than the first region 428. The second region 434 includes second data 436 and a second time stamp 438. The memory array 426 further includes a threshold 440.

The controller 412 includes an error correction code (ECC) engine 414, a threshold adjuster 418, and a refresh module 420. The controller 412 may also include a processor 416 coupled to the error correction code (ECC) engine 414. The threshold adjuster 418 and the refresh module 420 may be executable by the processor 416. The controller 412 may further include a random access memory (RAM) 422 coupled to the processor 416. The random access memory (RAM) 422 may store instructions 424 that are executable by the processor 416 to implement the threshold adjuster 418 at the refresh module 420.

In operation, a current time stamp request 408 may be sent from the data storage device 404 via the interface 406 to the host device 402. In response, the host device 402 may send a current time stamp 410 to the data storage device 404 via the interface 406. The current time stamp 410 may represent current day and time information.

The first data 430 may be read from the first region 428 and a number of errors in the first data 430 may be read and evaluated by the ECC engine 414 to produce a first error count. The threshold 440 (e.g., a selective refresh rate of the memory array 426) may be adjusted by the threshold adjuster 418 based on the first error count, thereby producing an adjusted threshold. For example, when the first error count is high, the adjusted threshold may be low so that he first region 428 is refreshed often. The refresh module 420 may compare the time difference between the current time stamp 410 received from the host device 402 and the first time stamp 432 from the first region 428. Based on the comparison, the refresh module 420 may selectively refresh the first region 428 with a selective refresh operation. A next iteration of the selective refresh process may consider the second region 434 of the memory array 426, and so forth.

Figure 5:
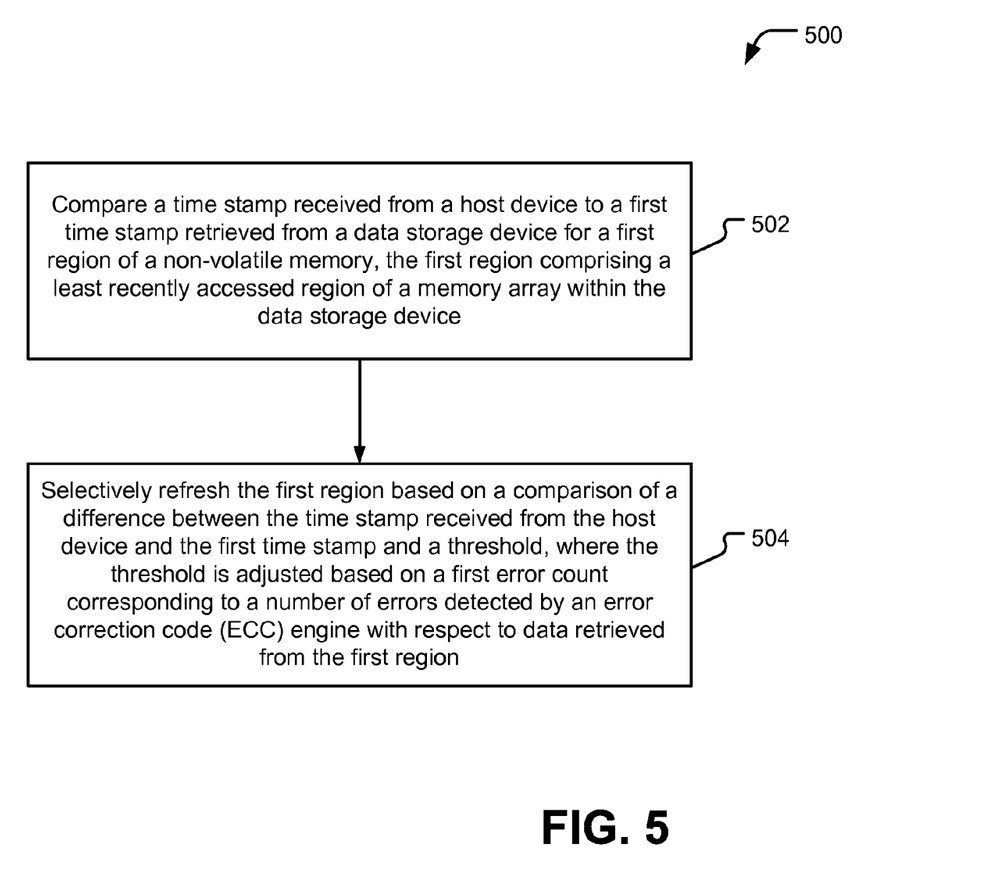
FIG. 5 is a flow diagram of a method of selectively refreshing a region of a non-volatile memory.

Referring to FIG. 5, a flow diagram of a method of selectively refreshing a region of a non-volatile memory is depicted and generally designated 500. The method 500 includes comparing a time stamp received from a host device to a first time stamp retrieved from a data storage device for a first region of a non-volatile memory, the first region including a least recently accessed region of a memory array within the data storage device, at 502. For example, in FIG. 1, the time stamp 102 received from the host device 104 may be compared by the refresh module 124 to the first time stamp 106 retrieved from the data storage device 108 for the first region 110 of the memory 112.

The method 500 also includes selectively refreshing the first region based on a comparison of a difference between the time stamp received from the host device and the first time stamp as compared to a threshold, at 504. The threshold is adjusted based on a first error count corresponding to a number of errors detected by an error correction code (ECC) engine with respect to data retrieved from the first region. For example, in FIG. 1, the first region 110 may be selectively refreshed by the selective refresh operation 132 based on a comparison of a difference between the time stamp 102 received from the host device 104 and the first time stamp 106 as compared to the adjusted threshold 122. The time threshold 114 may be adjusted by the threshold adjuster 120 to produce the adjusted time threshold 122 based on the first error count 116. For example, the adjusted time threshold 122 may be low when the first error count 116 is high, and vice versa.

Figure 6:
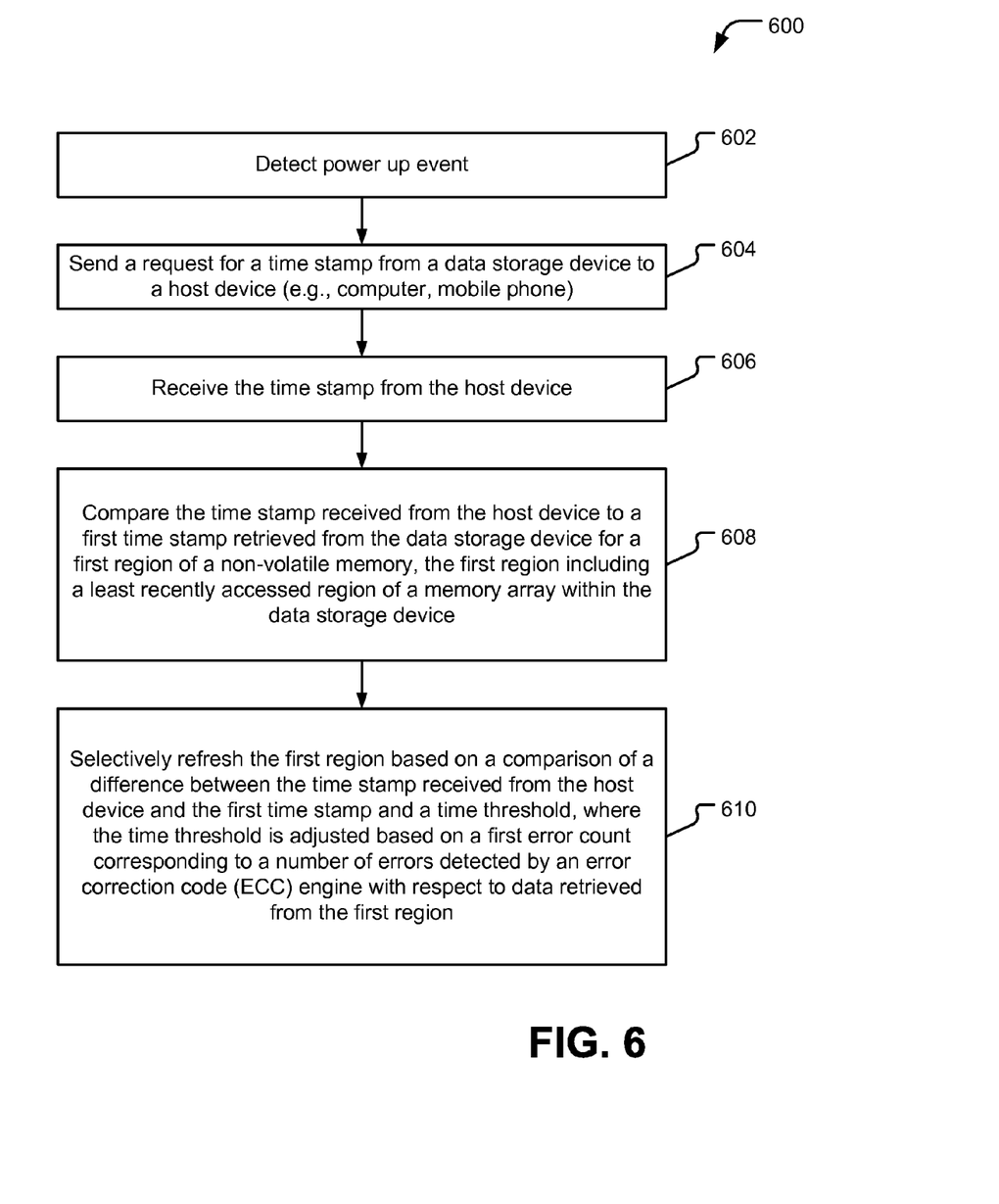
FIG. 6 is a flow diagram of a method of selectively refreshing a region of a non-volatile memory following detection of a power up event.

Referring to FIG. 6, a flow diagram of a method of selectively refreshing a region of a non-volatile memory following detection of a power up event is depicted and generally designated 600. The method 600 includes detecting a power up event, at 602. For example, in FIG. 4, a power up event at the data storage device 404 may be detected by the controller 412.

The method 600 also includes sending a request for a time stamp from a data storage device to a host device, such as a computer or a mobile phone, at 604. For example, in FIG. 4, the current time stamp request 408 may be sent from the data storage device 404 via the interface 406 to the host device 402. The method 600 further includes receiving the time stamp from the host device, at 606. For example, in FIG. 4, the current time stamp 410 may be received by the data storage device 404 via the interface 406.

The method 600 includes comparing the time stamp received from the host device to a first time stamp retrieved from the data storage device for a first region of a non-volatile memory, at 608. The first region including a least recently accessed region of a memory array within the data storage device. For example, in FIG. 4, the current time stamp 410 received from the host device 402 may be compared to the first time stamp 432 retrieved from the data storage device 404 for the first region 428 of the memory array 426.

The method 600 also includes selectively refreshing the first region based on a comparison of a difference between the time stamp received from the host device and the first time stamp as compared to a time threshold, at 610. The time threshold is adjusted based on a first error count corresponding to a number of errors detected by an error correction code (ECC) engine with respect to data retrieved from the first region. For example, in FIG. 4, the first region 428 may be selectively refreshed by the refresh module 420 based on a comparison of a difference between the current time stamp 410 received from the host device 402 and the first time stamp 432 as compared to the threshold 440. The threshold 440 may be adjusted by the threshold adjuster 418 based on a number of errors detected by the error correction code (ECC) engine 414 with respect to the first data 430 retrieved from the first region 428. For example, the threshold 440 may be reduced when the number of detected errors is high, and vice versa.

In a particular embodiment, there may be different thresholds for different regions of the memory array 426. Maintaining different thresholds for different regions of memory may enable more refined control over selective refresh rates for each of the different regions, thereby improving performance. Alternately, there may be a common threshold for all regions of the memory array 426, thereby reducing the amount of memory needed to implement the selective refresh process. Thresholds may be implemented as absolutes (e.g., "refresh all regions that have not been accessed since Jan. 1, 2000") or offsets (e.g., "refresh all regions that have a modification date older than six months"). When a threshold is implemented as an offset, the offset may be an offset from a default threshold. For example, when the default threshold is twelve months, an offset of negative six months would result in an effective threshold of six months and an offset of positive six months would result in an effective threshold of eighteen months. The offset may be determined for each memory region based on an error count or other parameters associated with each region. The offset may save space or logic to perform the selective refresh operations.

Although various components depicted herein are illustrated as block components and described in general terms, such components may include one or more microprocessors, state machines, or other circuits configured to enable the data storage device 108 of FIG. 1 or the data storage device 404 of FIG. 4 to perform the particular functions attributed to such components, or any combination thereof. For example, the controller 126 of FIG. 1 may represent physical components, such as hardware controllers, state machines, logic circuits, or other structures to enable the selective refreshing of regions of the data storage device 108 of FIG. 1.

For example, referring to FIG. 1, the refresh module 124 may be implemented using a microprocessor or microcontroller programmed to compare a difference between the time stamp 102 received from the host device 104 and the first time stamp 106 from the first region 110 of the memory 112 with the adjusted threshold 122 to determine whether or not to selectively refresh the first region 110 with the selective refresh operation 132. Similarly, referring to FIG. 4, the refresh module 420 of may include executable instructions 424 that are executed by the processor 416 and are stored at the RAM 422. Alternatively, or in addition, executable instructions that are executed by the processor 416 that may be included in the controller 412 may be stored at a separate memory location that is not part of the RAM 422, such as at a read-only memory (ROM) (not shown).

In a particular embodiment, the data storage device 108 of FIG. 1 may be a portable device configured to be selectively coupled to one or more external devices. However, in other embodiments, the data storage device 108 may be attached or embedded within one or more host devices, such as within a housing of a portable communication device. For example, the data storage device 108 may be within a packaged apparatus such as a wireless telephone, a personal digital assistant (PDA), a gaming device or console, a portable navigation device, or other device that uses internal non-volatile memory. In a particular embodiment, the data storage device 108 includes a non-volatile memory, such as a flash memory (e.g., NAND, NOR, Multi-Level Cell (MLC), Divided bit-line NOR (DINOR), AND, high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed, the scope of the present invention is to be determined by the broadest permissible interpretation of the following claims and their equivalents, and shall not be restricted or limited by the foregoing detailed description.

What is claimed is:

1. A method comprising:
   comparing a time stamp received from a host device to a first time stamp retrieved from a data storage device, the first time stamp associated with a first region of a memory within the data storage device; and
   selectively refreshing the first region in response to determining that a difference between the time stamp and the first time stamp satisfies a time threshold, wherein the time threshold is adjusted based on a first error count of errors detected by an error correction code (ECC) engine, and wherein the first error count is associated with first data that is retrieved from the first region.

2. The method of claim 1, wherein the time stamp is received by the data storage device upon connection of the data storage device to the host device.

3. The method of claim 1, wherein the first region is selectively refreshed in response to determining that the first error count satisfies an error count threshold.

4. The method of claim 1, wherein the time stamp is retrieved by accessing a file header of a file stored at the host device.

5. The method of claim 1, further comprising:
   sending a request for the time stamp from the data storage device to the host device; and
   receiving the time stamp from the host device in response to the request, wherein the time stamp represents day information and time information.

6. The method of claim 1, wherein the first region is refreshed in a background operating mode of a controller of the data storage device.

7. The method of claim 1, wherein the time stamp is received from the host device and compared to the first time stamp in response to a power up event at the data storage device.

8. The method of claim 1, further comprising:
   selectively refreshing a second region of the memory based on a second time stamp and based on a second error count, wherein the second region has been accessed more recently than the first region, the second region storing:
      second data;
      the second time stamp, wherein the second time stamp is updated upon writing the second data to the second region and wherein the second time stamp is updated in response to accessing the second data; and
      the second error count, wherein the second error count is based on a second number of errors detected by the ECC engine with respect to the second data read from the second region; and
   selectively refreshing a third region of the memory based on a third time stamp and based on a third error count, wherein the third region has been accessed more recently than the second region, the third region storing:
      third data;

the third time stamp, wherein the third time stamp is updated upon writing the third data to the third region and the third time stamp is updated in response to accessing the third data; and the third error count, wherein the third error count is based on a third number of errors detected by the ECC engine with respect to the third data read from the third region.

9. The method of claim 8, wherein the first region is selectively refreshed prior to refreshing the second region, and wherein the third region is selectively refreshed after refreshing the second region.

10. The method of claim 8, wherein each of the first error count, the second error count, and the third error count is compared to an error threshold and wherein each of the first region, the second region, and the third region is selectively refreshed in response to the respective error count satisfying the error threshold.

11. The method of claim 8, wherein in response to a determination that the first region is not to be refreshed based upon the first time stamp, refraining from refreshing the second region and the third region.

12. A data storage device detachedly coupleable to a host, the data storage device comprising:

a memory including a first region, the memory storing a first time stamp and a time threshold; and a controller coupled to the memory, the controller including:

an error correction code (ECC) engine configured to detect a first error count of errors associated with first data stored in the first region;

a time threshold adjuster configured to adjust the time threshold, based on the first error count, to produce an adjusted time threshold; and a refresh module arranged to selectively refresh the first region based on a comparison of the adjusted time threshold to a difference between the first time stamp and a time stamp that is received from the host.

13. The data storage device of claim 12, wherein the time stamp is received by the data storage device upon connection of the data storage device to the host.

14. The data storage device of claim 12, wherein the refresh module selectively refreshes the first region in response to the first error count satisfying an error count threshold.

15. The data storage device of claim 12, wherein the data storage device further comprises a mobile phone interface and wherein the first time stamp is received via the mobile phone interface.

16. The data storage device of claim 12, wherein the controller further includes a processor coupled to the error correction code (ECC) engine, and wherein the threshold adjuster and the refresh module are executable by the processor.

17. The data storage device of claim 16, wherein the controller further includes a memory coupled to the processor, the memory storing instructions that are executable by the processor.

18. The data storage device of claim 12, wherein the time stamp is received from the host and is compared to the first time stamp in response to a power up event at the data storage device.

19. A data storage device having an interface to a host computer having an operating system, the data storage device comprising:

a memory including a first region, the memory storing a first time stamp and storing a time threshold; and a controller coupled to the memory, the controller including:

an error correction code (ECC) engine configured to detect a first error count associated with first data stored in the first region;

a time threshold adjuster configured to adjust the time threshold, based on the first error count, to produce an adjusted time threshold;

a time stamp retrieval module configured to retrieve a time stamp from a header of a recently written file stored by the host computer; and a refresh module configured to selectively refresh the first region based on a comparison of the adjusted time threshold to a difference between the time stamp and the first time stamp.

20. The data storage device of claim 19, wherein the controller further includes a processor coupled to the error correction code (ECC) engine, and wherein the threshold adjuster and the refresh module are executable by the processor.

21. The data storage device of claim 19, wherein the refresh module selectively refreshes the first region based on a comparison of the first error count to an error count threshold.

22. The data storage device of claim 19, wherein the first region is selectively refreshed in a background operating mode of the controller.

* * * * *